(12) United States Patent
Hocevar

(10) Patent No.: US 6,934,343 B2
(45) Date of Patent: Aug. 23, 2005

(54) COMPUTING THE FULL PATH METRIC IN VITERBI DECODING

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 746 days.

(21) Appl. No.: 10/007,977

(22) Filed: Nov. 13, 2001

(65) Prior Publication Data

US 2002/0057749 A1 May 16, 2002

Related U.S. Application Data

(60) Provisional application No. 60/249,036, filed on Nov. 15, 2000.

(51) Int. Cl.$^7$ .............................. H03D 1/00; H04L 27/06
(52) U.S. Cl. ...................... 375/341; 375/262; 714/795; 714/796
(58) Field of Search ................................. 714/795, 796, 714/792; 375/262, 265, 341

(56) References Cited

U.S. PATENT DOCUMENTS

| 4,087,752 A | * | 5/1978 | Melvin ........................ 375/332 |
| 4,710,746 A | * | 12/1987 | Shimoda et al. .............. 341/51 |
| 5,081,651 A | * | 1/1992 | Kubo .......................... 375/341 |
| 5,291,524 A | * | 3/1994 | Itakura et al. .............. 375/341 |
| 5,295,142 A | * | 3/1994 | Hatakeyama ................ 714/794 |
| 5,375,129 A | * | 12/1994 | Cooper ....................... 714/795 |
| 5,384,560 A | * | 1/1995 | Yamasaki ................. 340/146.2 |
| 5,878,098 A | | 3/1999 | Wang et al. |
| 6,137,845 A | | 10/2000 | Wang |
| 6,259,749 B1 | * | 7/2001 | Andoh ........................ 375/341 |
| 6,490,327 B1 | * | 12/2002 | Shah .......................... 375/341 |
| 6,637,004 B1 | * | 10/2003 | Mizuno et al. ............. 714/796 |
| 6,707,849 B1 | * | 3/2004 | Zangi et al. ................ 375/233 |
| 2003/0123579 A1 | * | 7/2003 | Safavi et al. ............... 375/341 |

OTHER PUBLICATIONS

Hekstra, Andries P., "An Alternative to Metric Rescaling in Viterbi Decoders," *IEEE Transactions on Communications*, vol. 37, No. 11, Nov. 1989, pp. 1220–1222.

Hendrix, Henry, Texas Instruments Application Report, "Viterbi Decoding Techniques in the TMS320C54×Family," Jun. 1996, pp. 1–20.

* cited by examiner

Primary Examiner—Jean B. Corrielus
(74) Attorney, Agent, or Firm—Ronald O. Neerings; Wade James Brady, III; Frederick J. Telecky, Jr.

(57) ABSTRACT

By utilizing an additional counter and monitoring the maximum state metric at each stage, only forward progressing modulo wrap-arounds will occur and these can be counted. After decoding this count information, it can be used with the initial and final state metric values from the decoder to compute the desired full path metric. The method only requires monitoring state metric wrap-arounds moving in one direction and hence only needs to increment the extra counter as opposed to having to do likewise in the opposite direction. In another embodiment, the method can handle both forward and backward progressions by incrementing and decrementing a counter.

20 Claims, 2 Drawing Sheets

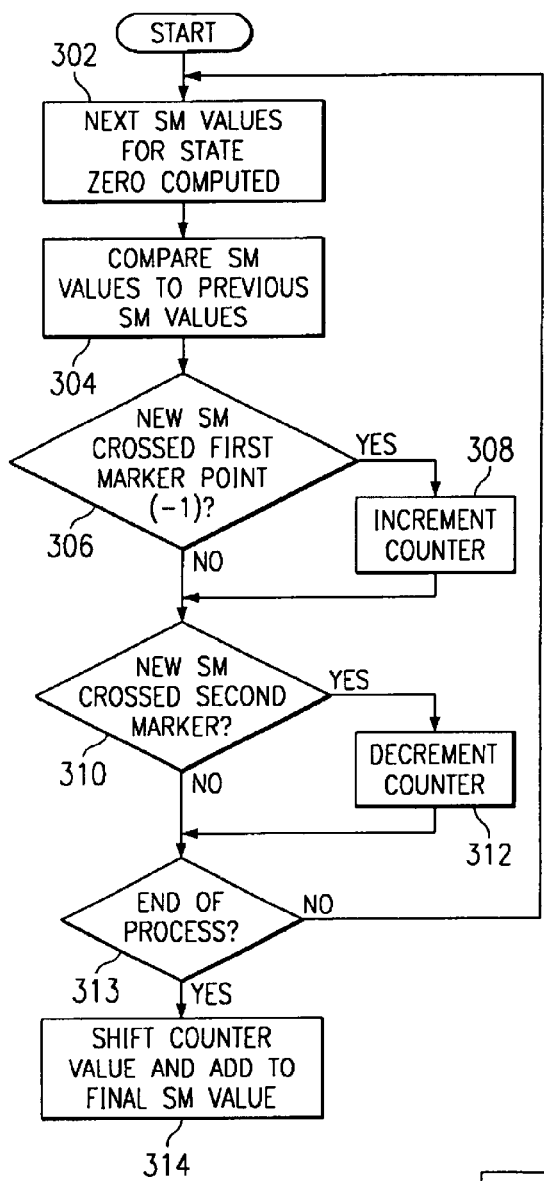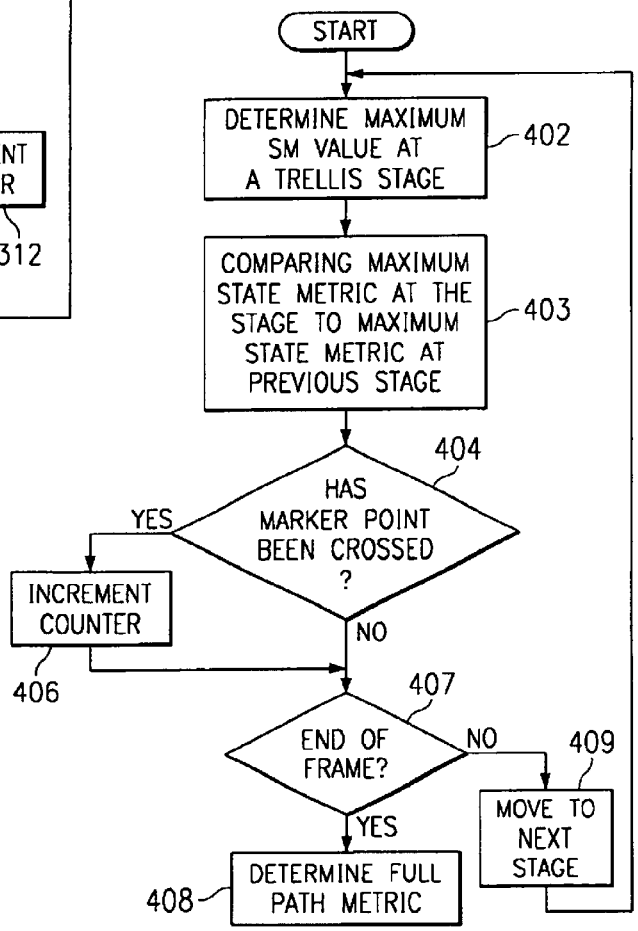

COMPUTING THE FULL PATH METRIC IN VITERBI DECODING

This application claims priority under 35 USC §119(e)(1) of provitional application Ser. No. 60/249,036, filed Nov. 15, 2000.

TECHNICAL FIELD

This invention relates in general to Viterbi decoding and more specifically to a method of computing the full path metric when performing Viterbi decoding.

BACKGROUND

The Viterbi algorithm is a method for performing maximum likelihood sequence detection and can be used for decoding received data that has been generated via a convolutional code. Only a brief discussion of convolutional codes will be given here since they are well know in the art, however, full explanations can be found in many publications including "Digital Communications, 3rd Edition," by J. G. Proakis, McGraw Hill, N.Y., 1995. Technical application details on Viterbi decoding can be found in publications such as "Viterbi decoding techniques in the TMS320C54x Family," by in H. Hendrix, DSP Application Note: SPRA071, Texas Instruments, Inc., Dallas, Tex., June 1996.

A convolutional encoder is a finite state machine and the trellis diagram shown in FIG. 1 illustrates a single shift register code with 16 states of code rate 1/n. The state indices are shown in columns, each column or stage corresponds to an input bit to output bits mapping, and the branches are the possible transitions moving from left to right. During encoding, an input bit is allocated to each stage and it chooses between the two branches exiting each state, and each choice produces a small set of n output bits. Assuming the process is started in a known state (usually state zero), a given frame of input bits will generate a single unique path through the trellis.

A problem when performing Viterbi decoding is to determine the unique path that the input bits and initial state caused to be taken through the trellis by using the received data, which is an estimate of the transmitted output bits. Because of the noise and disturbances that occur in transmission, this received data will typically be a corrupted version of the encoder's output bits. So it is usually not possible to decode with absolute certainty. Instead, a typical approach is to determine the 'most likely' data sequence or path. This is done by finding the path through the trellis that has the minimum distance. The distances being defined by the sum of the branch metrics along the path. The branch metrics are determined from the received data and each one represents the likelihood of a particular choice of output bit values. Each branch has one branch metric (BM) and the number of BMs for a trellis stage equals the number of unique choices for output bits for a stage.

The Viterbi algorithm provides a very efficient method for finding this "most likely" path. The Viterbi algorithm operates in a step-wise manner by processing a set of state metrics (state metrics can also be called path metrics) forward in time, stage by stage over the trellis. At each step, or stage, each state metric is updated using the branch metrics, and in effect, the optimal path to that state is determined using the optimal paths to the previous stage's states. This is done by taking each state and selecting the optimal one-step path, or branch, of the two possibilities, from the previous stage. The optimal branch is the one that would give the smallest next state metric as defined by adding its branch metric to the state metric of the state from which the branch originates. This is known as the; add, compare and select operation (ACS). Each branch corresponds to a set of possible output bits and its metric is a distance measure from those output bits to the received data. Actually the bits are usually mapped to a constellation point that is transmitted and the metric is the Euclidean distance between the received data and this constellation point.

As the above process is performed, the chosen branches for each state at each stage are recorded, hence, the full optimal paths to each state are known. However, to produce the decoder's output, which will be the most likely match to the input bits above, we choose a state and walk backward through the stages following the path given by the recorded branches. If this process is started at the end of the frame, the chosen starting traceback state will be the encoder's known ending state; usually this is state zero. Output bits are then produced immediately.

If the traceback process starts prior to the end of a frame, any state can be chosen from which to start, though it is better to choose the state with the minimum state metric because better performance will be obtained. After a certain distance, known as the convergence distance, all the optimal paths from the other states will have converged to a single path with high probability. After that point valid output bits can be taken from the traceback process.

After the entire frame has been decoded, the Viterbi algorithm also provides the minimum path distance or full path metric through the trellis. It is obvious that this represents the likelihood of the correctness of the decoded sequence since it is the sum of likelihood measures along this "best" path. Thus, it can be very useful information for the receiver's data recovery process or for the end user.

When implementing a Viterbi algorithm, either in a specifically designed apparatus or as software on a small processor, some issues arise. One issue concerns minimizing versus maximizing with positive and negative branch metrics. In the standard theoretical derivation, the branch metrics are positive. However, in a very common set of design applications, the branch metric computation can be greatly simplified such that the branch metrics can become both positive and negative, and the algorithm still correctly identifies the most likely trellis path. It is also common to then remove a negative sign from the BM computation and to maximize the summed metrics instead of minimizing, as this is equivalent mathematically. For the most part, this scenario will be assumed in the rest of this application, although either approach can be utilized.

Another design issue concerns keeping the state metric values within the valid number range that their storage mechanism provides. This is necessary because usually there is a limited range provided by the assigned storage area and the state metrics continually grow in magnitude with each trellis stage. However, the state metrics have the property that the largest minus the smallest, at any trellis stage, will always be a bounded number that is a linear function of the encoder's memory length and the largest possible magnitude of the branch metrics. Thus, simple normalizations can be used.

Two common normalization methods used are subtractive scaling and modulo normalization. Subtractive scaling simply repeatedly subtracts a value from all state metrics to keep them within the desired range. Modulo normalization as for example described in, "An alternative to metric resealing in Viterbi decoders," by A. P. Hekstra, IEEE Trans. Commun., vol. 37, no. 11, pp. 1220–1222, November 1989, simply constrains the arithmetic to occur in a modulo ring which is large enough such that the state metric differences can always be computed correctly. This is accomplished by simply making sure that the maximum possible difference in state metric values is less than ½ the size of the modulo ring. The modulo addition and subtraction can occur naturally in digital logic.

When modulo normalization is being used for the state metric updating process in a Viterbi decoder, critical information is lost such that the full decoding path metric cannot be obtained. This metric can have important uses within the larger system (e.g., cellular telephone, etc.) in which the decoder operates. A need thus exists in the art for a method of computing a full path metric when performing Veterbi decoding which can overcome some of the problems found in the prior art.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

FIG. 3 shows a flowchart showing the steps taken to compute the full path metric in accordance with one embodiment of the invention.

FIG. 4 shows a flowchart showing the steps taken to compute the full path metric in accordance with another embodiment of the invention.

DETAILED DESCRIPTION OF THE PREFERRED EMBODIMENT

Figure 1:
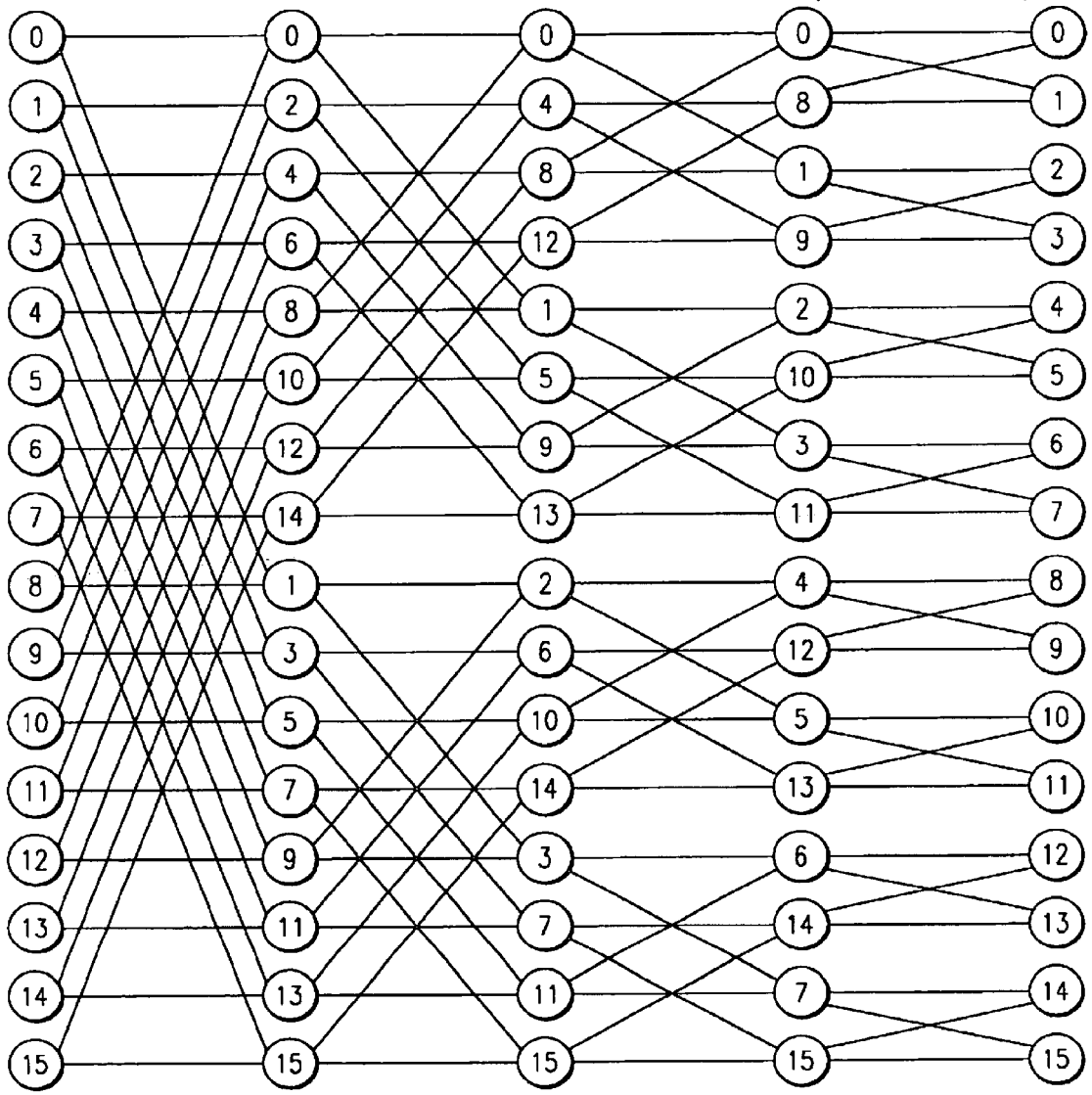
FIG. 1 shows a prior art trellis diagram for rate 1/n code with constraint length of five.

While the specification concludes with claims defining the features of the invention that are regarded as novel, it is believed that the invention will be better understood from a consideration of the following description in conjunction with the drawing figures, in which like reference numerals are carried forward.

Figure 2:
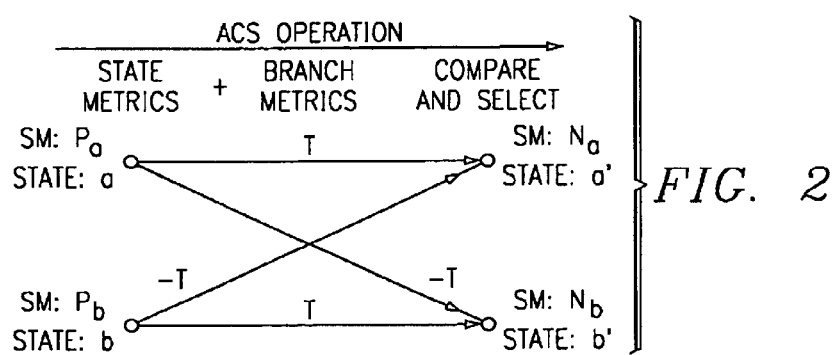
FIG. 2 shows a trellis butterfly structure for ACS operations showing symmetry of branch metrics in accordance with the invention.

A property of this particular Viterbi process that will be useful as will be explained further below is that at every stage during decoding, the maximum state metric will be greater than or equal to that of the previous stage. This can be shown by analyzing the ACS operation for a butterfly (called this because the lines look like a butterfly) of the trellis as shown in FIG. 2. The branch metrics for each butterfly for the most common scenario has the symmetrical properties shown in FIG. 2. Specifically, if the branch metric for the top horizontal branch is T, then the branch metric for the lower horizontal branch will also be T, and the branch metrics for the diagonal branches will both be −T.

The next state metrics for states a and b will be:

$$N_a = \max(P_a + T, P_b - T)$$

$$N_b = \max(P_a - T, P_a + T)$$

And so the maximum $N_a$ and $N_b$ will be:
$M_N = \max(N_a, N_b) = \max(P_a + T, P_b - T, P_a - T, P_a + T)$. If, $M_p = \max(P_a, P_b)$, it can then easily be reasoned that $M_N \geq M_p$. This can be seen since $M_p$ will be either $P_a$ or $P_b$, and $M_N$ can choose from $M_p + T$ or $M_p - T$, thus $M_N$ has to be greater than or equal to $M_p$.

Computing the Full Path Metric

When normalization is used, the full path metric can not be computed completely. This is because the true value of the state metrics at the end of frame are not known. Most often the normalization process causes the accumulating path metrics to be rescaled numerous times prior to reaching the end of frame. Hence, the accuracy of the relative differences between state metrics has been retained but the accuracy with respect to the starting metric values has not been retained.

If subtractive scaling is used, these subtracted values can be additively accumulated during the process and the resulting value added back to the final state metrics to determine their true end of frame values.

If modulo normalization is used, methods for monitoring the normalization during the process and controlling an auxiliary counter can be developed. One such method would be to follow a simple state sequence through the trellis as the forward process is operating. The sequence would be such that each state has branches to the previous state and to the next state in the sequence. The sequence composed of only the zero state would be sufficient.

Considering this sequence of zero states, the method would operate as follows as shown in the flowchart of FIG. 3. When each next state metric value for state zero has been computed in step 302, that value is compared to the previous state metric for state zero in step 304. If the new state metric has crossed a marker point, e.g. moved from negative numbers to positive numbers (positive direction) by crossing −1 in step 306 as an example, then the counter is incremented by 1 in step 308. On the other hand, if the new state metric has crossed another (second) marker point in step 310, e.g. moved from positive numbers to negative numbers (negative direction) by crossing 0, then the counter is decremented by 1 in step 312. In this manner, the counter simply keeps a count of how many times the group of state metric values has completely moved around the number ring, also referred to as a modulo wrap-around. If the state metric ACS operations do not use modulo normalization, the next higher order bit in the SM word representation would be incremented. At the end of the process, this counter value is simply shifted (multiplied) to the left the correct number of bits and added (appended) to the final state metric value for state zero in step 314. Note that it is critical that this method includes the step of decrementing the counter because it is possible at times for the state metric value to decrease relative to the previous state metric value.

Another method for the case of modulo normalization can be developed in accordance with the invention, one that does not require the counter to be decremented, nor the monitoring for these reversals of state metric growth. This second method makes use of the maximum state metric value of each trellis stage. This value, and its corresponding state, are often determined during normal operations because traceback operations usually use this state when a traceback has to be performed prior the end of frame for large frames. Recall that previously above a property was stated which said that this maximum state metric value cannot decrease in value relative to the maximum from the previous trellis stage. Hence, this fact can be used to develop a method that is not required to monitor and facilitate reversals in state metric growth.

This method would operate as follows and as highlighted in the flowchart of FIG. 4:

While traversing the trellis in the standard forward direction and performing the state metric updates, determine the maximum state metric value at a stage of the trellis in step 402. Finding this maximum can be done easily by sequentially comparing the state metric after, or during, a stage's computation, but prior to storing it in memory.

Compare the maximum SM at the stage to the maximum SM at the previous stage in step 403 to determine if a modulo wrap-around (marker point been crossed) has occurred in step 404. This can be easily detected if the new SM is positive and the previous stage's SM is negative, viewing the SMs as 2's complement numbers. If such a wrap-around occurred in step 404, an auxiliary counter is incremented by one in step 406.

In effect this monitoring is preferably using the −1 value as a marker point or threshold against which the advancement of maximum SM values from one stage to the next is compared. Theoretically, any value in the number range could be used as the threshold with appropriate adjustments in the remaining computations. In step 407 it is determined if the end of the frame has been reached, if it has not been reached in step 409 the routine moves to the next stage in the trellis and the previously mentioned steps are repeated.

At the end of the frame, the full path metric (FPM) can then be determined in step 408 from the following formula:

$$FPM=(M+C_{adj})-I-D$$

where $$D=(M-E)_{mod(K)}.$$

In the above, "M" is the maximum SM value for the last stage at the end of frame. "E" is the SM value for the ending state of the frame used for traceback (i.e., the last state in the decoded path, and also the known ending state in the encoder). Alternately, "I" is the SM value for the initial state of the frame (i.e., the known initial encoder state), and $K=2^t$ is the size of the modulo ring where "t" is the number of bits used to represent the SM values. The value from the auxiliary counter is left shifted by t bits (same as multiplying by a fixed value) to obtain the adjusted value $C_{adj}$. The quantity, $M+C_{adj}$, can be obtained either through addition or more simply by appending due to the nature of $C_{adj}$. The computation for FPM is done by treating its operands as unsigned quantities and using no modulo operations.

Most often in practice, the initial state and the ending state are both state zero. It is also assumed that initial conditions are set properly for the results to be correct. The most straight-forward approach from a mathematical view is to determine the maximum of the initial SM values at the start of the frame. And to use this value as the previous stage's maximum SM for the very first monitoring comparison which occurs after the first trellis stage. From a practical viewpoint, a simpler approach is to require that all the initial SM values be greater than or equal to 0 but less than $2^t/2$, and set the initial maximum SM value to 0.

Extension to Method

The above overall method can be extended in a simple manner so that it can operate in a mode where it is not necessary to compute the maximum SM and perform the monitoring process at every stage in the trellis, but rather, only at selected stages. This extension is important because it allows the use of this method on Viterbi decoder architectures that operate on multiple trellis stages simultaneously, and for which it is simpler to determine the maximum SM values only after each particular group of contiguous trellis stages. Such a Viterbi decoder architecture is disclosed in U.S. patent application entitled "Flexible Viterbi Decoder For Wireless Applications", having application Ser. No. 60/117,763, and filed on Jan. 29, 1999, and U.S. patent application entitled "Enhanced Viterbi Decoder for Wireless Applications", having application Ser. No. 60/173,995, and filed on Dec. 30, 1999. Both patent applications are hereby incorporated by reference as if fully set forth herein.

The method of the extension operates the same as the previously described process except that the current stage's maximum SM and the previous stage's maximum SM are replaced by the maximum SM for the last stage of the present group of stages and the maximum SM of the last stage of the previous group of stages, respectively. The monitoring and conditional increment of the counter then occur only after each such group of stages is completed.

This procedure will operate correctly provided the conditions are such that the maximum SM does not wrap-around faster than can be detected by observations at the end of each group of stages. This condition will be satisfied if the maximum SM always increases across any one group of stages by less than ½ the numerical range provided for the SM values; i.e., less than $2^t/2$. If the overall, maximum possible branch metric magnitude, times the maximum number of trellis stages in any such group of stages, is less than ½ the numerical range, then the increase in maximum SM value will satisfy the necessary condition.

As previously discussed, the above described embodiments can be formulated in terms of minimizing instead of maximizing and the procedures and formulas described still apply by making the appropriate mathematical changes known to those skilled in the art.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for computing the full path metric (FPM) in a Viterbi decoder that uses modulo normalization, comprising the steps of:
   (a) determining the maximum state metric value at each stage;
   (b) comparing the maximum state metric at a current stage to the maximum state metric at a previous stage to determine if a marker point has been crossed;
   (c) incrementing a counter if the marker point has been crossed in step (b); and
   (d) determining the FPM using the formula:

$$FPM=(M+C_{adj})-I-D$$

where $D=(M-E)_{mod(K)}$, and where "M" is the maximum state metric value for the last stage at the end of frame, "E" is the state metric value for the ending state of the frame used for traceback, "I" is the state metric value for the initial state of the frame, $K=2^t$ is the size of a modulo ring where "t" is the number of bits used to represent the state metric values, and $C_{adj}$ is the value of the counter when it is adjusted by "t" bits.

2. A method as defined in claim 1, wherein step (a) is performed while performing state metric updates.

3. A method as defined in claim 1, wherein in step (d) determining the $(M+C_{adj})-I-D$ is done by treating operands as unsigned quantities and using no modulo operations.

4. A method as defined in claim 1, wherein in step (a) finding the maximum state metric at each stage comprises the step of:

comparing sequentially the state metrics after or during, a stage's computation.

5. A method as defined in claim 4, wherein the sequential comparison of the state metrics is done prior to storing them.

6. A method as defined in claim 1, wherein in step (b) the comparisons are performed by viewing the state metrics as two's complement numbers.

7. A method as defined in claim 1, wherein in steps (a) and (b) the maximum state metric of the current stage and the maximum state metric of the previous stage are replaced by the maximum state metric for the last stage of a present group of stages and the maximum state metric of the last stage of a previous group of stages, respectively.

8. A method as defined in claim 7, wherein step (c) is only performed after each such group of stages is completed.

9. A method as defined in claim 1, wherein the Viterbi decoder operates on groups of multiple trellis stages simultaneously and the current stage's maximum state metric and the previous stages maximum state metric are replaced by the maximum state metric for the last stage of the present group of stages and the maximum state metric of the last stage of the previous group of stages, respectively.

10. A method as defined in claim 9, wherein the maximum state metric always increases across any one group of stages by less than $2^t/2$.

11. A method as defined in claim 1, wherein in step (b) a marker point has been crossed if a modulo wrap-around has occurred.

12. A method as defined in claim 7, wherein step (a) is performed while performing state metric updates.

13. A method as defined in claim 7, wherein in step (d) determining the $(M+C_{adj})-I-D$ is done by treating operands as unsigned quantities and using no modulo operations.

14. A method as defined in claim 7, wherein in step (a) finding the maximum state metric at each stage comprises the step of:

comparing sequentially the state metrics after or during, a stage's computation.

15. A method as defined in claim 14, wherein the sequential comparison of the state metrics is done prior to storing them.

16. A method as defined in claim 7, wherein in step (b) the comparisons are performed by viewing the state metrics as two's complement numbers.

17. A method as defined in claim 9, wherein step (a) is performed while performing state metric updates.

18. A method as defined in claim 9, wherein in step (d) determining the $(M+C_{adj})-I-D$ is done by treating operands as unsigned quantities and using no modulo operations.

19. A method as defined in claim 9, wherein in step (a) finding the maximum state metric at each stage comprises the step of:

comparing sequentially the state metrics after or during, a stage's computation.

20. A method as defined in claim 19, wherein the sequential comparison of the state metrics is done prior to storing them.

* * * * *